United States Patent [19]

Sheyon et al.

[11] Patent Number: 4,687,693
[45] Date of Patent: Aug. 18, 1987

[54] ADHESIVELY MOUNTABLE DIE ATTACH FILM

[75] Inventors: Gregory M. Sheyon; Joseph A. Aurichio, both of Anderson, S.C.

[73] Assignee: Stauffer Chemical Company, Westport, Conn.

[21] Appl. No.: 744,352

[22] Filed: Jun. 13, 1985

[51] Int. Cl.$^4$ .......................... D06N 7/04; B32B 3/00; H01B 17/00

[52] U.S. Cl. ................................ 428/148; 428/195; 428/210; 174/212; 156/238

[58] Field of Search ...................... 428/148, 195, 210; 156/238; 117/3.1, 6, 212, 227; 161/208; 154/140; 174/212

[56] References Cited

U.S. PATENT DOCUMENTS

| 2,493,267 | 1/1950 | Scholl | 206/80 |
|---|---|---|---|
| 2,725,325 | 11/1955 | Seymour | 154/140 |
| 2,808,352 | 10/1957 | Coleman et al. | 117/227 |
| 2,964,587 | 12/1960 | Minot | 174/117 |
| 3,001,902 | 9/1961 | Cooke et al. | 154/45.9 |
| 3,267,623 | 8/1966 | Block | 51/406 |
| 3,461,537 | 8/1969 | Lotz | 29/413 |
| 3,497,383 | 2/1970 | Olyphant et al. | 117/212 |
| 3,565,750 | 2/1971 | Evans | 161/208 |
| 3,690,909 | 9/1972 | Finley | 117/6 |
| 3,741,786 | 6/1973 | Torrey | 117/3.1 |
| 3,871,936 | 3/1975 | Boyer et al. | 156/238 |
| 4,147,669 | 4/1979 | Shaheen | 252/512 |
| 4,171,397 | 10/1979 | Morrow | 428/195 |
| 4,233,103 | 11/1980 | Shaheen | 156/331 |
| 4,247,590 | 1/1981 | Hayakawa et al. | 428/210 |
| 4,606,962 | 8/1986 | Reylek et al. | 428/148 |

FOREIGN PATENT DOCUMENTS 7713911  6/1979  Netherlands ........................ 428/148

Primary Examiner—John E. Kittle
Assistant Examiner—Patrick J. Ryan
Attorney, Agent, or Firm—Richard P. Fennelly

[57] ABSTRACT

The present invention is a die attach film which is adapted for adhesive mounting to a dicing frame. The film contains a support film, a curable die bonding adhesive releasably mounted on the support film which is adapted to receive semiconductor wafer, semiconductor die, and the like, and adhesive means to bond the support film to a dicing frame. In one embodiment the adhesive means comprise pressure sensitive adhesive means on the support film itself adjacent the portions designed to contact the dicing frame. In another embodiment, the adhesive means comprise a larger tacky film bonded to the bottom of the support film for the die attach film.

12 Claims, 3 Drawing Figures

ADHESIVELY MOUNTABLE DIE ATTACH FILM

BACKGROUND OF THE INVENTION

1. Field of the Invention

The present invention relates to a die attach film which is adapted to be adhesively mounted to a dicing frme (also termed a "film frame wafer carrier") for use, for example, as a dicing film in the dicing of semiconductor wafers and subsequent die bonding of individual die during die packaging.

2. Description of Related Developments

The present invention is an improved version of the dicing film product shown in co-pending U.S. Ser. No. 697,242, filed Feb. 1, 1985, entitled "CARRIER FILM WITH CONDUCTIVE ADHESIVE FOR DICING OF SEMICONDUCTOR WAFERS" and of the die-attach film described in co-pending U.S. Ser. No. 574,815, filed Jan. 30, 1984, entitled "CONDUCTIVE DIE ATTACH TAPE", both of which are incorporated herein by reference.

Currently, in the semiconductor industry, semiconductor wafers are diced into individual die by placing the wafer on a tacky film, followed by the scribing or dicing of the wafer into the die which are then removed from the tacky film, without any adherent die bonding adhesive. The die are then placed in the chip carrier after a suitable curable die bonding adhesive has been separately added to the chip carrier. This procedure is labor intensive and costly since it requires that the dicing operation and the die attach step be performed in two distinct stages.

Recently, the above-referenced U.S. patent applications have proposed solutions to this problem wherein a novel tape product is supplied which has the necessary curable die-bonding adhesive releasably supported on its surface. Such a tape product can be used to support the semiconductor wafer during the dicing operation and yet provide the necessary die bonding adhesive component for the later die bonding operation to the chip carrier. After the dicing step has been performed with such a product, the die, with adherent partially cured adhesive, can then be removed from the surface of the support film for later placement in the chip carrier. Alternatively, (as described in U.S. Ser. No. 574,815, filed Jan. 30, 1984, which is also incorporated herein by reference) the tape can merely carry adhesive to which previously cut die can be mated. After the die and adhesive are brought together, the die, with adherent partially cured adhesive, can be removed for placement in the chip carrier.

The present invention is specifically directed to an improved version of the general type of products described in each of the above-referenced applications.

SUMMARY OF THE PRESENT INVENTION

The present invention relates to an improved version of the types of products described above which is particularly adapted for adhesive mounting in conventional dicing frames which are commonly used during semiconductor wafer dicing and die packaging. The present products comprise a support film, a curable die bonding adhesive pattern releasably mounted on the support film, and adhesive means to bond the support film to a dicing frame. One example of adhesive means to carry out the bonding of the support film to the dicing frame is adhesive, e.g., pressure sensitive or heat activatable adhesives, applied to the support film itself at those peripheral portions of the support film that are intended to contact the dicing frame. An alternative means for bonding the die attach film to the dicing frame is to affix the support film of the die attach film to a larger tacky film which, at its periphery, is capable of bonding to the frame.

DESCRIPTION OF THE DRAWINGS

The present invention will be further understood by reference to the drawings which form a portion of the present specification wherein.

DETAILED DESCRIPTION OF THE PRESENT INVENTION

The present die attach film 11 comprises a suitable support film 12 which can be formed from a wide variety of materials including paper, foil, or polymer. Preferably, the support film has a release layer or coating to facilitate the release of the curable die bonding adhesive which will be described below. The types of support films and release coatings in co-pending U.S. Ser. No. 697,424, for example, can be used in regard to the present invention. It is possible to dispense with the release coating if a support film 12 is chosen which has an adherent release characteristic in regard to the curable die bonding adhesive which is selected. For example, a heating step, as described more fully in U.S. Ser. No. 562, 899, filed Dec. 19, 1983, which is incorporated herein by reference, can be utilized when polyolefin support films are used.

The curable die bonding adhesive 13 can be of the general type that is used by the semiconductor industry for die bonding operations. The various requirements for such adhesives are known in the art and are described, for example, in above-described U.S. Ser. No. 697,424, and in U.S. patent applications Nos. 628,541 and 660,593, both of which are incorporated herein by reference. One preferred adhesive is the polyimide-modified epoxy adhesive composition which is described in U.S. patent application Ser. No. 628,541, filed July 6, 1984, and which comprises an epoxy rsin, a soluble polyimide resin, and a reactive monoepoxy diluent to dissolve the soluble polyimide resin into the epoxy resin. This adhesive is preferred for relatively low temperature die bonding operations. Another adhesive 13 which has utility for relatively higher temperature die bonding operations is described in U.S. patent application Ser. No. 660,593, filed Oct. 15, 1984. It comprises a soluble polyimide resin, a solvent for the polyimide resin, an epoxy resin, a hardener, a catalyst to accelerate the curing of the epoxy resin, a crosslinking agent reactive with the polyimide solvent, and a catalyst to catalyze the crosslinking reaction. The adhesives which can be used as die bonding adhesives for the present invention are broadly selected from electrically conductive and/or thermally conductive adhesives which are useful for die bonding. The adhesive 13 is preferably partially reacted, to a tacky state prior to affixing the wafer or die to its surface.

Figure 1:
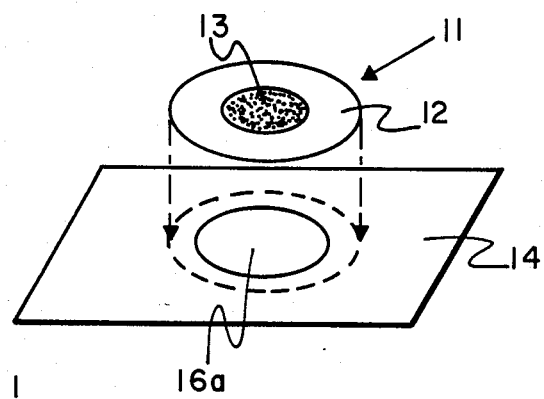
FIG. 1 is an exploded view showing the die attach film wherein a larger tacky film is the intended adhesive means for bonding to the dicing frame.
Figure 2:
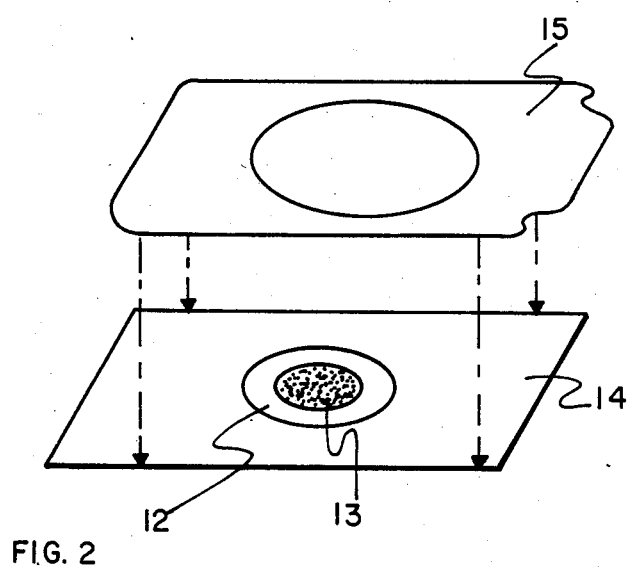
FIG. 2 is an exploded view showing the dicing frame and the adhesively mountable die attach film of the present invention.
Figure 3:
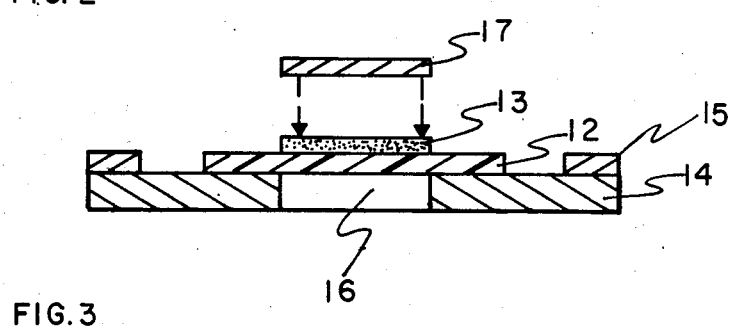
FIG. 3 is a side view, in exaggerated perspective, showing the composite of dicing frame and adhesively mountable die attach film.

In the embodiment of the present invention wherein the adhesive is applied to the support film 12 itself, the adhesive, if applied, for example, to the upper surface of the film 12 is applied at area(s) outside the area(s) occupied by the curable die bonding adhesive. In this embodiment the size of the die attach film 11 would be larger than the embodiment shown in FIG. 1 to insure that its peripheral portions can make contact with the dicing frame 15. In the embodiment of the present invention in which the film 11 of the present invention is applied to a larger, tacky sheet 14, it is possible to use the conventional tacky film used to support semiconductor wafers during dicing. This film is denoted "NITTO film" in the industry and merely has a sufficient degree of tackiness to hold the present film product and to provide a point of attachment of the composite structure to a conventional dicing frame 15. In cases where this film 14 is used, the tacky portions of the film holding the present tape 11 must be peripheral to the tape itself and any curble die bonding adhesive that it may carry. Preferably, in regard to use of the composite film for wafer dicing, the area 16 under the section of the support film 12 which will hold the adhesive 13/wafer 17 composite is cut out from the tacky film 14. This is designated by reference numeral 16a in FIG. 1. By doing so, the mating of the support film 12 carrying the die bonding adhesive 13 and the tacky film 14 will not lead to undesired air entrapment under the area to be occupied by the adhesive/wafer subcombination. Such air entrapment can undesirably give the adhesive (and adherent wafer) an undulating surface which might exceed the close tolerances required during the dicing step.

It is within the scope of the present invention to protect the exposed curable adhesive 13 with a suitable release covering. If desired, the release covering can comprise a suitable sheet of release coated paper or the like.

The foregoing represents certain embodiments of the present invention but should not be construed in a limiting sense. The claims which follow set forth the scope of protection desired.

We claim:

1. A die attach film adapted for adhesive mounting to a dicing frame, when the frame is brought into contact with the film, which comprises:
   (a) a support film;
   (b) a curable die bonding adhesive releasably mounted on the support film; and
   (c) adhesive means to bond the support film to a dicing frame, said adhesive means comprising a larger tacky film to which the support film carrying the adhesive (b) is bonded.

2. A film as claimed in claim 1 wherein the die bonding adhesive is adapted to support a semiconductor wafer for dicing, when the wafer is brought into contact with the adhesive.

3. A film as claimed in claim 1 wherein the die bonding adhesive is adapted to support a semiconductor die after it has been diced, when the die is brought into contact with the adhesive.

4. A film as claimed in claim 1 wherein the die bonding adhesive is electrically conductive.

5. A film as claimed in claim 2 wherein the die bonding adhesive comprises an electrically conductive adhesive.

6. A film as claimed in claim 1 wherein the portion of the tacky film under the die bonding adhesive adapted to support the wafer, when the wafer is brought into contact with the adhesive, has been removed.

7. In combination, a dicing frame and the film of claim 1.

8. In combination, a dicing frame and the film of claim 2.

9. In combination, a dicing frame and the film of claim 4.

10. In combination, a dicing frame and the film of claim 5.

11. In combination, a dicing frame and the film of claim 6.

12. A film as claimed in claim 1 which further comprises a release covering to protect the adhesive (b).

* * * * *